United States Patent [19]
Trausch

[11] 3,991,231
[45] Nov. 9, 1976

[54] PROCESS FOR THE PRODUCTION OF CIRCUIT BOARDS BY A PHOTO-ETCHING METHOD
[75] Inventor: Günter Trausch, Munich, Germany
[73] Assignee: Siemens Aktiengesellschaft, Berlin & Munich, Germany
[22] Filed: Mar. 28, 1975
[21] Appl. No.: 563,164

[30] Foreign Application Priority Data
Mar. 29, 1974 Germany............................ 2415487

[52] U.S. Cl................................... 427/96; 29/625; 96/36.2; 156/3; 156/11; 156/16; 156/18; 427/264; 427/271; 427/282; 427/287; 427/404
[51] Int. Cl.² .......................................... B05D 5/12
[58] Field of Search ............ 29/625; 96/36.2; 156/3, 156/18, 11, 16; 427/96, 264, 271, 282, 287, 404

[56] References Cited
UNITED STATES PATENTS
3,666,549  5/1972  Rhodenizer et al.................. 96/36.2
3,737,314  6/1973  Ruleff et al. .......................... 96/36.2
3,775,200  11/1973  de Nobel et al. ....................... 156/11

Primary Examiner—Cameron K. Weiffenbach
Attorney, Agent, or Firm—Hill, Gross, Simpson, Van Santen, Steadman, Chiara & Simpson

[57] ABSTRACT

A process or method for producing circuit boards by photo-etching characterized by exposing a first photo-sensitive layer applied to a conductive metal layer on the substrate, removing the unexposed portion of the photo-sensitive layer to expose portions of the metal conductive layer, applying a second metal layer of corrosion-resistant material on the exposed portions of the first metal layer, applying a second photo-sensitive layer, exposing the second photo-sensitive layer using the same mask with the width of the second unexposed pattern, which is an etch-resistant material, being greater than the width of the second metal layer, removing the exposed portions of the second photo-sensitive layer, and etching the first metal layer with a controlled under-etching of the second photo-sensitive layer up to the edges of the second metal layer and then removing the unexposed pattern of photo-sensitive material.

14 Claims, 9 Drawing Figures

PROCESS FOR THE PRODUCTION OF CIRCUIT BOARDS BY A PHOTO-ETCHING METHOD

BACKGROUND OF THE INVENTION

Field of the Invention

The present invention relates to a method of producing circuit boards by photo-etching method of a base material provided on at least one side with the metal foil which is subsequently etched to provide a conductive pattern.

Prior Art

It has been found desirable to have circuit boards which have a circuit pattern on a surface which pattern is formed of a conductive metal layer with a thin corrosion-resistant layer on an exposed surface thereof. To produce these circuit boards, the circuit board with an exposed metal layer of the conductive metal is printed with a galvo-resistant negative image of the required conductor pattern. The conductor image formed by the negative image is galvanically reinforced with a thin, corrosion-resistant and etch-resistant metal layer. After the negative image is removed, the regions of the metal foil which do not correspond to the conductor pattern are removed by etching. During the etching process, more metal is removed at the edge of the conductor pattern beneath the etch-resistant metal layer than in the direct vicinity of the base material. This under-etching or under-cutting occurs at the edges of the conductor pattern immediately beneath the etch-resistant metal layer due to a longer exposure of this area to the etching agent. Furthermore, the contact between the two different metals of the two layers may accelerate the removal of the conductive metal layer in the area immediately adjacent to the corrosion-resistant layer.

The under-etching or under-cutting of the corrosion-resistant layer generally leads to breaking off of the overhanging projections of the corrosion-resistant layer from the condutor pattern. This not only results in a loss of accuracy of the contour and shape of the pattern but mainly has the danger that the broken off pieces will form short circuits in the conductive pattern of the circuit board.

Several attempts have been made to reduce the extent of the under-etching or under-cutting of the corrosion-resistant layer. In one attempt, which is disclosed in German Auslegeschrift No. 2,061,991, the etch-resistant and non-corrosive metal layer of the conductor pattern prior to the step of etching is covered with an additional etch-resistant layer. This procedure merely reduces the problems associated with the under-cutting or under-etching, but does not completely prevent the under-etching or under-cutting and therefore does not prevent the occurrence of the above-mentioned disadvantages and problems.

SUMMARY OF THE INVENTION

The present invention provides a method for the production of circuit boards by a photo-etching method in which the under-etching of the corrosion-resistant metal layer on the circuit conductor pattern is completely prevented.

To accomplish this aim, the method of the present invention comprises the steps of providing a substrate having at least one surface provided with a first metal layer of conductive metal, providing a first photo-sensitive layer on the first metal layer, said first photo-sensitive layer being a negatively acting photo-sensitive layer, positioning a mask on the first photo-sensitive layer, said mask having a masking pattern of a configuration of the conductive pattern with the width of the portion of the masking pattern being larger than the width of the corresponding portions of the conductive pattern at its top, exposing the first photo-sensitive layer by projecting light through the mask to form an unexposed pattern in the first photo-sensitive layer, said unexposed pattern having a size and shape of the conductive pattern with portions having a width less than the width of the corresponding portions of the masking pattern, removing the unexposed pattern of the first photo-sensitive layer to expose the first metal layer therebeneath, galvanically applying a second metal of a thin, corrosion-resistant metal on the exposed first metal layer, subsequently removing the remaining portions of the first photo-sensitive layer, covering the second metal layer and the exposed portions of the first metal layer with a second photo-sensitive layer, said second photo-sensitive layer being a positively acting photo-sensitive layer and having etch-resisting properties, reapplying the mask in the same position, exposing the second photo-sensitive layer with the unexposed pattern of the second photo-sensitive layer having a width greater than the corresponding width of the second metal layer and overlapping portions of the first metal layer adjacent the edges of the second metal layer, removing the exposed portions of the second photo-sensitive layer to leave an etch-resisting unexposed pattern, etching the circuit board to produce the conductive pattern in the first metal layer with under-etching of the first metal layer beneath the unexposed pattern of the second photo-sensitive layer to the edges of the second metal layer and subsequently removing the remaining portions of the second photo-sensitive layer so that by selecting the amount of overlap of the unexposed pattern of the second photo-sensitive layer to correspond with the amount of under-etching of the first metal layer, the surface of the second metal layer is completely supported by the first metal layer.

The method of the present invention can be utilized with a circuit board having a single conductive pattern or a circuit board having more than one conductive pattern separated by insulating layers in which the outermost conductive pattern is connected to an inner pattern or a pattern on the opposite surface by one or more holes extending through the insulating layers. To accomplish this, the method includes forming at least one hole in the substrate, galvanically depositing at least a third metal layer on a portion of the first metal layer and the surfaces of the holes prior to the application of the first photo-sensitive layer.

The difference in the size of the unexposed pattern of the first photo-sensitive layer and the unexposed pattern of the second photo-sensitive layer can be obtained by various procedures. For example, the first photo-sensitive layer may be thicker than the second photo-sensitive layer and for example the first photo-sensitive layer can be a foil of photo-sensitive material while the second photo-sensitive layer is in the form of a thin photo lacquer layer. In addition thereto, the smaller unexposed pattern for the first photo-sensitive layer can be obtained by overexposing the first photo-sensitive layer while exposing the second photo-sensitive layer to a normal degree or extent. Another way of obtaining the smaller unexposed pattern of the first photo-sensitive layer is to expose the first photo-sensitive layer by using strayed or diffused light whereas the second photo-sensitive layer is obtained by using a parallel directed light during the step of exposing. Various combinations of the above exposing procedures can also be used to obtain the different sized unexposed patterns in the two photo-sensitive layers.

DESCRIPTION OF THE PREFERRED EMBODIMENTS

Figure 6:
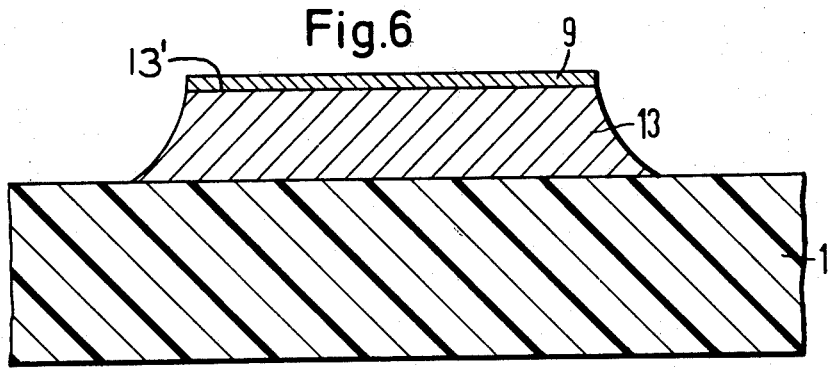
FIG. 6 is a cross-sectional view of the conductor pattern of the circuit board produced by the method of the present invention.

The principles of the present invention are particularly useful in a method of producing a circuit board as illustrated in FIG. 6 having a substrate 1 of insulating material with a conductive or conductor pattern on a surface thereof. The conductive pattern, as illustrated, is formed by etching a metal layer such as copper to form a conductive path 13 which conductive path has an upper surface 13' covered by a layer 9 of a corrosion-resistant and etch-resistant metal such as tin or a tin alloy. As illustrated, the layer 9 is free from undercutting or under-etching and is contiguous with the upper surface 13' of the conductive path 13 and firmly attached at all points to the surface 13'.

Figure 1:
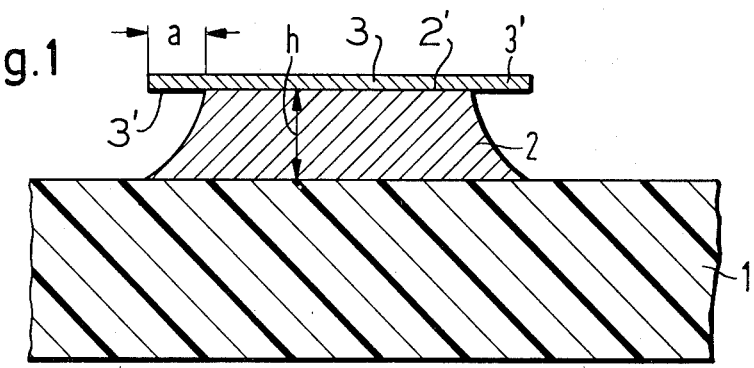
FIG. 1 shows a cross section of a conductor path produced in a known manner.
Figure 2:
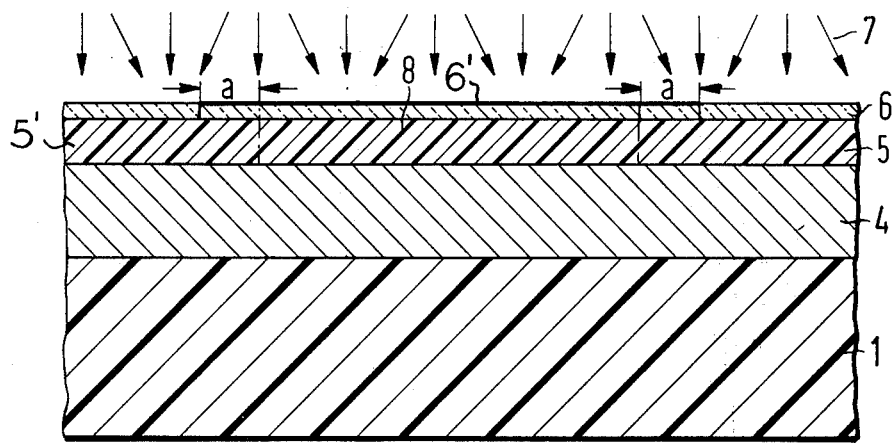
FIG. 2 is a partial cross section of a circuit board having a first photo-sensitive layer during the step of exposing the first photo-sensitive layer.

In comparison, the prior art method of forming a conductive pattern produces a pattern having cross section illustrated in FIG. 1. In this instance, the conductive path 2 of copper with an upper surface 2' has been under-etched or under-cut during the etching process so that a corrosion-resistant and etch-resistant layer 3 extends beyond the upper surface 2' and has edge portions 3' which overhang the edges of the conductive path 2. As illustrated, the amount of under-etching that produces the overhanging edges 3' is indicated by the dimension $a$ and the height or thickness of the copper layer 2 of the conductive path is indicated by the dimension $h$. When tin is used for the etch-resistant metal layer 3, and the conductor path has a thickness or height of $h = 70\mu$m, the degree of under-etching is $a = 45\mu$m. When spray etching machines are used with an alkaline etching agent, the ratio of $h:a$ is $\approx 1.5$.

The method of the present invention, which produces a conductive pattern of FIG. 6, without any under-etching or overhanging edge portions comprises providing a substrate or base 1 of insulating material which base 1 has at least one surface covered by a first metal layer 4 of a conductive metal such as copper foil. A first photo-sensitive layer 5 is applied to the surface of the first metal layer 4 and is a negatively acting photo-sensitive material. The layer 5 may be in the form of a photo foil if desired. After the layer 5 is applied to the metal layer 4, a mask 6, which has a masking pattern 6' which blocks or masks transmission of light, is positioned on layer 5 by appropriate positioning means such as aligning pins received in apertures in the mask 6 and substrate 1. The masking pattern 6' has a shape corresponding to conductor pattern with a width of the portion corresponding to path 13 being greater than the width of the conductor path at its top. As illustrated, the width of 6' is approximately $2a$ larger than the width of the conductive path at its top. To expose the first photo-sensitive layer 5, a strayed or diffused light 7 is used with the result that a region 8 of the photo-sensitive pattern 5 is unexposed but portions beneath the edge portions $a$ of the masking pattern 6' are exposed along with the portions not covered by the masking pattern to produce an exposed region or portion 5'.

Figure 3:
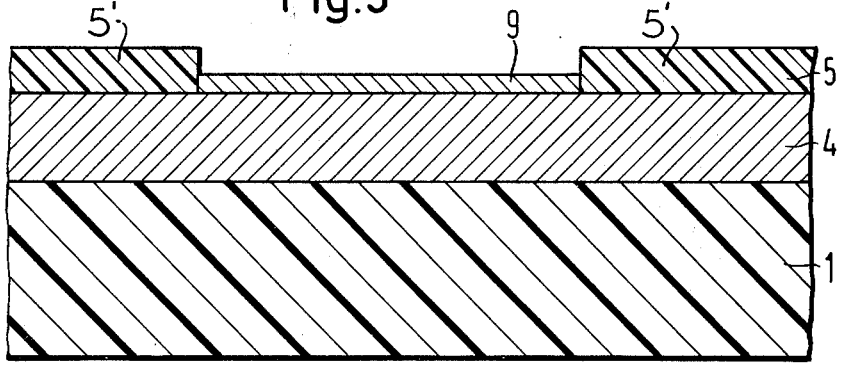
FIG. 3 is a cross section of the board after the step of galvanically applying the second metal layer.

Subsequent to the exposing of the first photo-sensitive layer 5, the mask 6 is removed and the unexposed portion or region 8 of the photo-sensitive layer 5 is removed by developing the photo-sensitive layer 5 to expose a surface portion of the first metal layer 4 which is framed in the exposed portions 5' of the layer 5 (FIG. 3). Subsequent to the removal of the unexposed region 8 of the first photo-sensitive layer 5, a second metal layer 9 of a corrosion-resistant metal is galvanically applied to the exposed region of the first metal layer 4 with the exposed portion or region 5' of the layer 5 acting as a galvano-resistant negative image of the desired conductor pattern that is to be produced.

Figure 4:
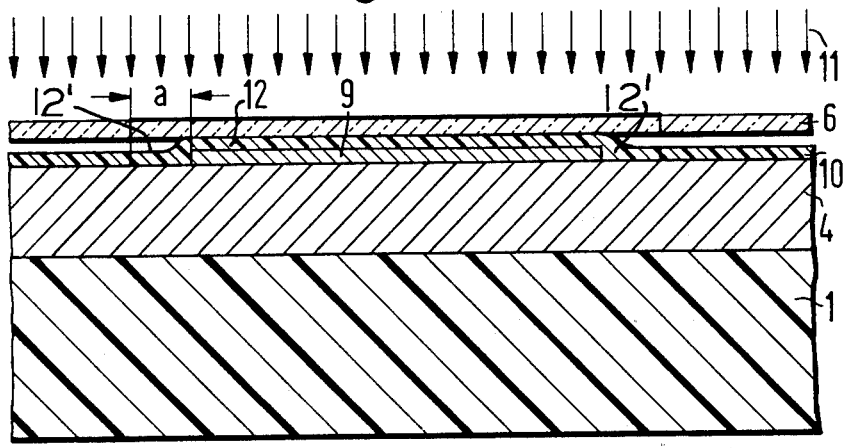
FIG. 4 is a cross-sectional view of the circuit board illustrating the step of exposing the second photo-sensitive layer.

After applying the second metal layer 9, the remaining portion 5' of the first photo-sensitive layer 5 is removed and a second photo-sensitive layer 10 is applied to cover both the first and second metal layers. The second photo-sensitive layer 10 is a positively acting photo-sensitive layer or foil. After applying the second photo-sensitive layer 10 (FIG. 4), the mask 6 is repositioned in the same position that it assumed during the first exposing step and such repositioning can be obtained by using aligning pins to hold the mask in the exact re-aligned position. With the mask 6 positioned, the second photo-sensitive layer is exposed such as by parallel directed light beams 11. This forms an unexposed portion or pattern 12 in the photo-sensitive layer 10 which has a greater width than the width of the second metal layer 9 and has edge portions 12' substantially the size of $a$ which edge portions 12' cover the edges of the second metal layer 9 and overlap a portion of the first metal layer 4 adjacent each edge of the second metal layer 9.

Figure 5:
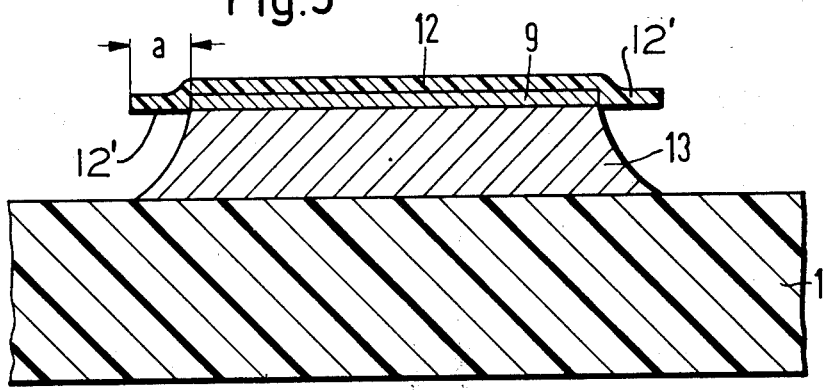
FIG. 5 is a cross-sectional view of the circuit board illustrating the results of the etching step.

Subsequent to the step of exposing the second photo-sensitive layer 10, the layer is developed and the exposed portions removed to leave the unexposed portion 12 (FIG. 5). After removal of the exposed portion of the second photo-sensitive layer, the substrate is etched with a suitable etching material to remove the exposed portions of the first metal layer 4 with under-etching or under-cutting of the edge portions 12' to an extent of the dimension a to form the conductive path 13. The portion 12 of the layer 10 acts as an etch-resistant layer and protects the side edges of the second metal layer 9. After the etching step, the portion 12 of the second photo-sensitive layer is removed to provide the conductor pattern of FIG. 6.

Due to the fact that the amount of overlap 12' corresponds to the amount of under-cutting or under-etching during the etching step and since the edges of the second layer 9 are covered by the portion 12, the edges of the second layer 9 terminate at the edge of the surface 13' of the conductor path 13 and are tightly bonded thereto. Thus, there is no overhang such as the overhang 3' caused by the under-etching as illustrated in FIG. 1. To accomplish this, the size of the unexposed portion 8 of the first photo-sensitive layer 5 and the unexposed portion 12 of the second photo-sensitive layer 10 are selected or controlled so that the amounts of under-cutting of the edge of portion 12 equals the width of overlapping portion 12'. The amount of under-cutting as mentioned above can be calculated for the process from known data or easily calculated or determined by experimentation.

It should be pointed out that while the embodiment of the method was discussed using diffused light 7 for exposing the first photo-sensitive layer and the second exposure was done by parallel directed light 11, the obtaining of the two patterns 8 and 12 in the first and second photo-sensitive layers can be accomplished by over-exposing the first layer 5 so that portions of the layer 5, which underlie the edges of the masking pattern 6' are exposed and then exposing the second photo-sensitive layer to the normal extent. It also should be noted the different size or width of the two patterns 8 and 12 can be obtained by using a thick layer of photo-sensitive foil for the first layer 5 and a thin lacquer layer for the second photo-sensitive layer 10 so that if scattered light is used to expose both layers, the inward penetration of the light during the exposure of the second layer is less than the penetration during the exposure of the first layer.

Figure 7:
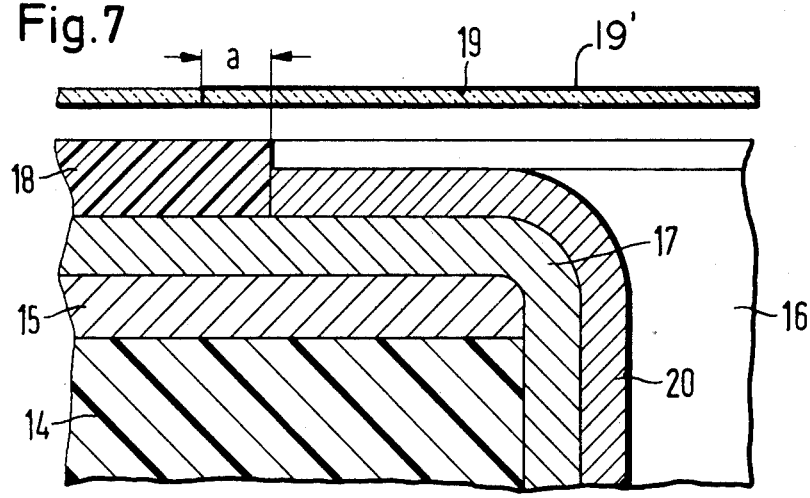
FIG. 7 is a cross-sectional view of a circuit board having a coated through-hole subsequent to galvanically applying the second metal layer.

The above method was described using a substrate having a single surface having a first metal layer 4. The method may be used on a substrate having a metal layer on each surface or a substrate having multilayers laminated between insulating layers with the inner conductor layers already formed and only the outer layer to be etched. This outer layer may be connected by a plated through-hole to one or more inner layers. In FIG. 7, a multi-layer laminate, which has completed inner layers, has an outer insulating layer 14 with a first copper layer 15 provided on a surface thereof. To form a through contact between the first layer 15 and an inner layer (not illustrated), a through-hole 16 is bored into the laminate and the walls of this hole are rendered conductive by chemical copper deposition. A layer 17 of copper, which layer is a third layer, is applied to the copper foil or layer 15 and the inner wall of the through-hole 16 by a surface galvanization. A first photo-sensitive layer 18 which is a negatively acting photo foil or layer is applied to the copper layer 17. This first photo layer 18 is then exposed by a mask 19 having the desired patterns 19' with the sufficient extra width a. The unexposed portion of the first photo-sensitive layer 18 is removed by development of the first photo-sensitive layer 18 and a second metal layer 20 which is a tin-lead alloy is galvanically applied to the exposed portion of the third layer 17 which includes the hole 16 and portions overlying the first layer 15.

Figure 8:
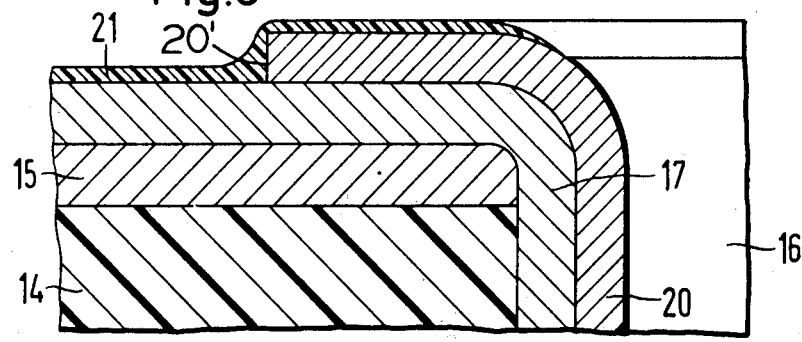
FIG. 8 illustrates a cross section of the circuit board of FIG. 7 after applying the second photo-sensitive layer.

Subsequent to this, the remaining portion of the first photo-sensitive layer 18 is removed and a second photo-sensitive layer 21 is applied. Since the second photo-sensitive layer 21, which is a positively acting layer, is applied by a roller, portions of the layer 20 in hole 16 are not covered but the edge 20' is covered and protected as illustrated in FIG. 8.

Figure 9:
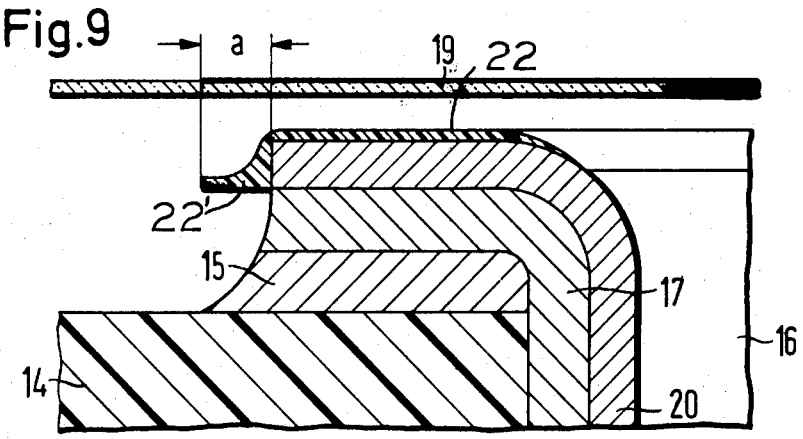
FIG. 9 illustrates a cross section of a circuit board of FIG. 8 after the etching step but prior to removing the second unexposed portions of the photo-sensitive layer.

The mask 19 (FIG. 9) is then repositioned and the photo-sensitive layer 21 is exposed to produce an unexposed portion 22. By developing the layer 21, the exposed portions are removed leaving the unexposed region 22 which covers the second layer 20 and has edge portions 22' which extend and overlap a portion of the third metal layer 17 adjacent to the edges of the layer 20. After etching, as illustrated in FIG. 9, the uncovered portions of the first layer 15 and the third layer 17 are removed with under-etching of the overlapping edge portion 22' of the unexposed portion 22 of the photo-sensitive layer 21 which unexposed portion 22 acts as an etch resisting mask. After the etching step, the masking portion 22 is removed and as in the embodiment illustrated in FIG. 6, the lead-tin layer 20 does not have any overhang and the metal layers such as 15 and 17 are not under-cut or under-etched beneath this tin-lead layer.

As pointed out hereinabove, the amount of under-etching is substantially proportional to the thickness or height of the coating or coatings being etched. Thus, the extent or dimensions of the amount of the second masking patterns such as 12 or 22 can be readily determined to limit any under-etchings to be only beneath the overlapping portions 12' or 22'. Thus, the second metal layer such as layer 9 or layer 20 are not under-cut by the etching step and are firmly bonded or arranged to the metal layer disposed therebeneath.

Although various minor modifications may be suggested by those versed in the art, it should be understood that I wish to employ within the scope of the patent granted hereon, all such modifications as reasonably and properly come within the scope of my contribution to the art.

I claim:

1. A method for producing a circuit board having a substrate with a conductive pattern of conductive portions on a surface thereof, said conductive pattern being formed by a pattern of a first conductive metal on said surface with a surface of the first metal covered by a corrosion-resistant metal layer, the method comprising the steps of providing a substrate having at least one surface provided with a first metal layer of conductive metal, providing a first photo-sensitive layer on the first metal layer, said first photo-sensitive layer being a negatively acting photo-sensitive layer, positioning a mask on the first photo-sensitive layer, said mask having a masking pattern of a configuration of the conductive pattern to be formed on the substrate, exposing the first photo-sensitive layer by projecting light through the mask to form an unexposed pattern in the first photo-sensitive layer, said unexposed pattern having a size and shape of the conductive pattern with a width less than the width of the masking pattern, removing the unexposed pattern of the first photo-sensitive layer to expose the first metal layer therebeneath, galvanically applying a second metal layer of corrosion-resistant metal on the exposed first metal layer, subsequently removing the remaining portions of the first photo-sensitive layer, covering the second metal layer and exposed portions of the first metal layer with a second photo-sensitive layer, said second photo-sensitive layer being a positively acting photo-sensitive layer having etch resisting properties, positioning the mask on the second photo-sensitive layer in the same position on the substrate that it had during the previous step of exposing, exposing the second photo-sensitive layer to form an unexposed pattern in the second photo-sensitive layer having a width greater than the corresponding width of the second metal layer and overlapping portions of the first metal layer adjacent the edges of the second metal layer, removing the exposed portion of the second photo-sensitive layer to leave an etch-resistant unexposed pattern, etching the circuit board to produce the conductive pattern in the first metal layer with under-etching of the first metal layer beneath the unexposed pattern of the second photo-sensitive layer to the edges of the second metal layer, and subsequently removing the remaining second photo-sensitive layer so that by selecting the amount of overlap of the unexposed pattern of the second photo-sensitive layer to correspond with the amount of under-cutting of the conductive metal layer, the surface of the second metal layer is completely support by the first metal layer.

2. A method according to claim 1, wherein the step of exposing a first photo-sensitive layer comprises exposing the first photo-sensitive layer with diffused light and the step of exposing the second photo-sensitive layer comprises exposing the layer utilizing parallel directed light.

3. A method according to claim 1, wherein the step of exposing the first photo-sensitive layer includes over-exposing the first layer and wherein the step of exposing the second photo-sensitive layer includes exposing the second layer to a normal extent.

4. A method according to claim 1, wherein a defined distance between the first photo-sensitive layer and the mask is provided by putting a thin transparent layer between them to obtain a greater amount of light under-cutting and wherein the step of exposing the second photo-sensitive layer is accomplished with the second photo-sensitive layer in direct contact with the mask without the transparent layer being present.

5. A method according to claim 3, wherein the step of exposing the first photo-sensitive layer includes using a strayed light and wherein the step of exposing the second photo-sensitive layer includes using parallel directed light.

6. A method according to claim 1, wherein the first photo-sensitive layer is applied as a foil to the first metal layer and wherein the second photo-sensitive layer is applied in the form of a thin photo lacquer layer.

7. A method according to claim 1, wherein the step of applying the first photo-sensitive layer comprises applying a thick layer and wherein the step of applying the second photo-sensitive layer applies a layer which is thinner than the first photo-sensitive layer.

8. A method according to claim 7, wherein the step of exposing the first thick photo-sensitive layer includes over-exposing the layer and the step of exposing the second photo-sensitive layer exposes the second layer to a normal extent.

9. A method according to claim 7, wherein the step of exposing the first photo-sensitive layer exposes the first layer with diffused light and wherein the step of exposing the second photosensitive layer exposes the layer with parallel directed light.

10. A method according to claim 1, which further includes prior to the step of applying the first photo-sensitive layer, forming holes through the substrate at desired location, galvanically depositing at least a third metal layer on a portion of the first layer and the surfaces of the holes.

11. A method according to claim 10, wherein the first photo-sensitive layer is applied as a thick layer on the first metal layer and portions of the third metal layer and the second photosensitive layer is applied as a thinner layer than the first photosensitive layer.

12. A method according to claim 10, wherein the step of applying the first photo-sensitive layer applies a photo-sensitive foil onto the first metal layer and portions of the third metal layer and wherein the step of applying the second photo-sensitive layer applies to a thin photo lacquer layer on the first and second metal layers and portions of the third metal layer.

13. A method according to claim 10, wherein the first photo-sensitive layer is over-exposed and the step of exposing the second photo-sensitive layer is controlled to expose it to a normal extent.

14. A method according to claim 10, wherein the step of exposing the first photo-sensitive layer uses diffused light and wherein the step of exposing the second photo-sensitive layer uses parallel directed light.

* * * * *